United States Patent
Ono et al.

(10) Patent No.: US 8,253,245 B2
(45) Date of Patent: Aug. 28, 2012

(54) COMMUNICATION DEVICE

(75) Inventors: Naoko Ono, Tokyo (JP); Toshiya Mitomo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/052,192

(22) Filed: Mar. 21, 2011

(65) Prior Publication Data

US 2012/0074512 A1 Mar. 29, 2012

(30) Foreign Application Priority Data

Sep. 28, 2010 (JP) ................ P2010-216711

(51) Int. Cl.
*H01L 23/34* (2006.01)

(52) U.S. Cl. ........ 257/728; 257/252; 257/428; 257/692; 257/E31.002

(58) Field of Classification Search ........... 257/252, 257/428, 692, 728
See application file for complete search history.

(56) References Cited

U.S. PATENT DOCUMENTS

| 6,525,410 | B1 * | 2/2003 | Gelsomini et al. | 257/678 |
| 6,838,773 | B2 * | 1/2005 | Kikuchi et al. | 257/773 |
| 7,312,528 | B2 * | 12/2007 | Watanabe et al. | 257/728 |
| 7,629,667 | B2 * | 12/2009 | Usami | 257/531 |
| 2004/0077124 | A1 * | 4/2004 | Ogawa | 438/106 |

FOREIGN PATENT DOCUMENTS

JP 2008-252207 A 10/2008

* cited by examiner

*Primary Examiner* — Jarrett Stark
*Assistant Examiner* — Nicholas Tobergte
(74) *Attorney, Agent, or Firm* — Holtz, Holtz, Goodman & Chick, PC (57) ABSTRACT

A communication device according to an embodiment includes an antenna transmitting/receiving a high frequency signal, a semiconductor chip having four corners and four sides processing the high frequency signal, and a substrate on which a first wiring connected to ground, a second wiring supplying power to the semiconductor chip, a third wiring connected to a protection element or circuit of the semiconductor chip, and fourth wirings transmitting a signal from the semiconductor chip are formed by plating, and the semiconductor chip is mounted.

8 Claims, 11 Drawing Sheets

COMMUNICATION DEVICE

CROSS-REFERENCE TO RELATED APPLICATIONS

This application is based upon and claims the benefit of priority from the prior Japanese Patent Application No. 2010-216711, filed on Sep. 28, 2010; the entire contents of which are incorporated herein by reference.

FIELD

Embodiments described herein relate generally to a communication device in which an antenna is incorporated in a semiconductor package.

BACKGROUND

A communication device having an operating frequency of a high frequency band of about 60 GHz includes an antenna, a semiconductor chip inputting/outputting a high frequency signal to/from the antenna, a mounting substrate on which the semiconductor chip is mounted, and so on. The antenna is normally formed on the semiconductor chip or the mounting substrate, and these antenna, semiconductor chip, and mounting substrate are packaged with resin, ceramic, or the like. For example, there is a communication device in which the antenna is formed on the mounting substrate of the semiconductor chip, and the antenna, semiconductor chip, and mounting substrate are packaged.

DETAILED DESCRIPTION

A communication device according to an embodiment includes an antenna transmitting/receiving a high frequency signal, a semiconductor chip having four corners and four sides processing the high frequency signal, and a substrate on which a first wiring connected to ground, a second wiring supplying power to the semiconductor chip, a third wiring connected to a protection element or circuit of the semiconductor chip, and fourth wirings transmitting a signal from the semiconductor chip are formed by plating, and the semiconductor chip is mounted. The substrate further has a first to fourth substrate main face electrodes formed at front ends of the first to fourth wirings on a substrate main face, which is a semiconductor mounting face, for connecting the first to fourth wirings to the semiconductor chip and a first to fourth substrate rear face electrodes formed at front ends of the first to fourth wirings on a substrate rear face opposite to the semiconductor mounting face for connecting the first to fourth wirings to an external device, and at least one of the first to third wirings has an extended wiring for plating, which is formed to extend to a substrate edge portion for performing the plating, and at least one of the fourth wirings does not have the extended wiring for plating, which is formed to extend to the substrate edge portion for performing the plating. The antenna is disposed to be deviated to one corner among four corners of the semiconductor chip or to one side among four sides of the semiconductor chip from a center portion of the semiconductor chip. The extended wiring for plating is formed by extending the first to third wirings to the substrate edge portion at a corner or along a side other than the one corner or the one side.

Hereinafter, embodiments of the present invention will be described in detail with reference to the drawings.

First Embodiment

Figure 1:
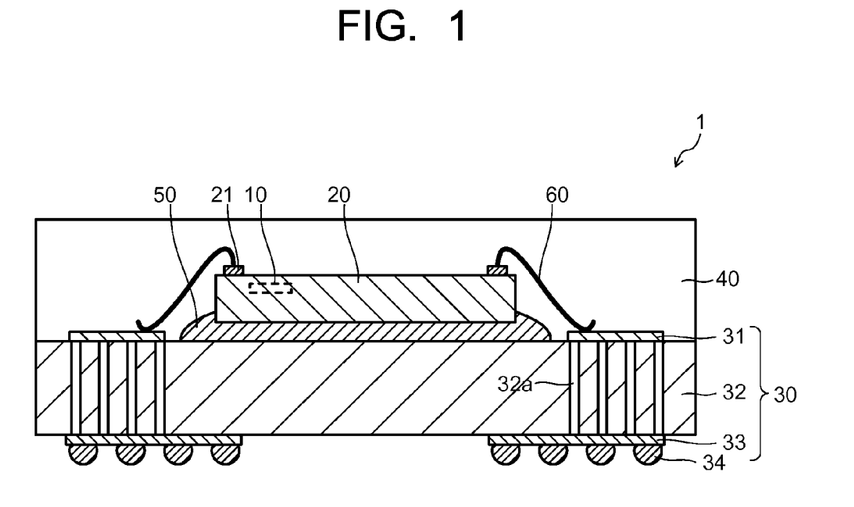
FIG. 1 is a transparent cross-sectional view of a communication device according to a first embodiment.
Figure 2:
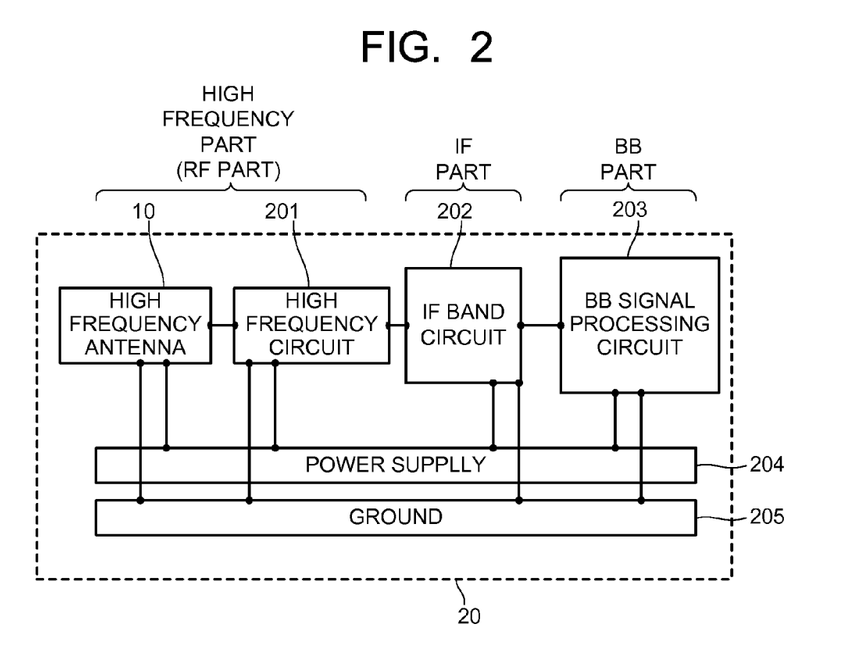
FIG. 2 is a circuit structure diagram of a semiconductor chip according to the first embodiment.
Figure 3:
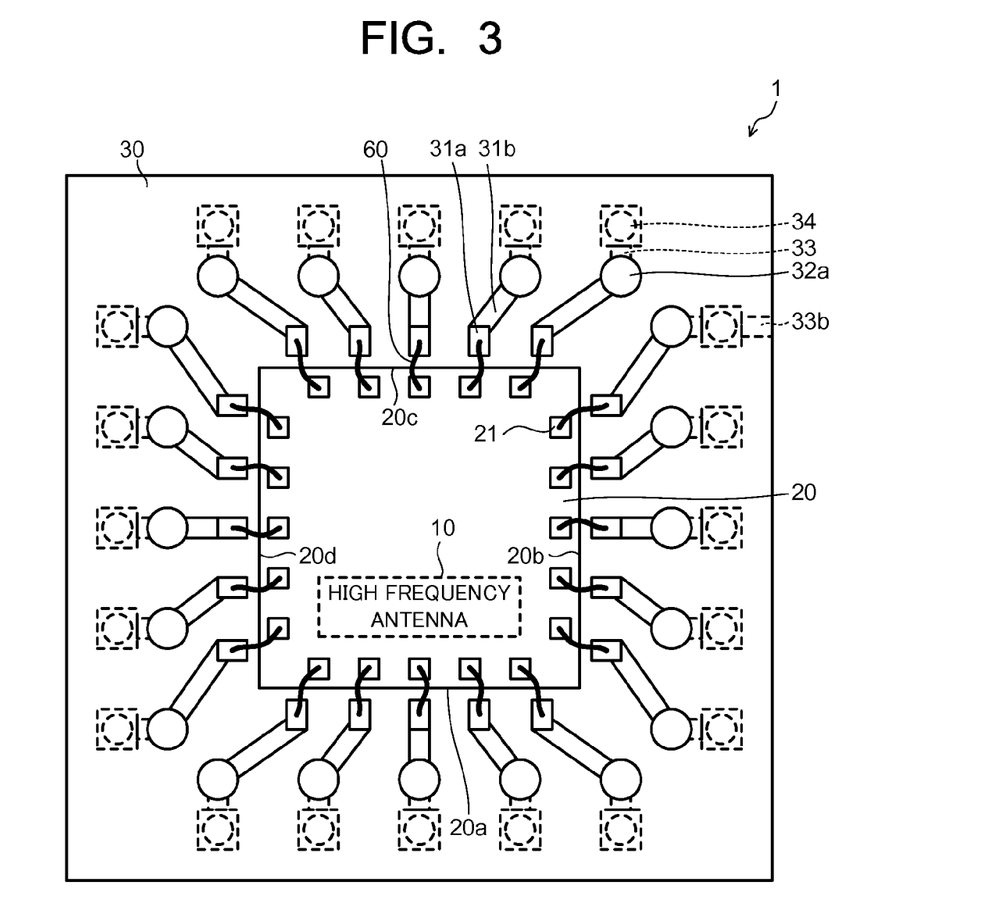
FIG. 3 is a transparent top view of the communication device according to the first embodiment.
Figure 4:
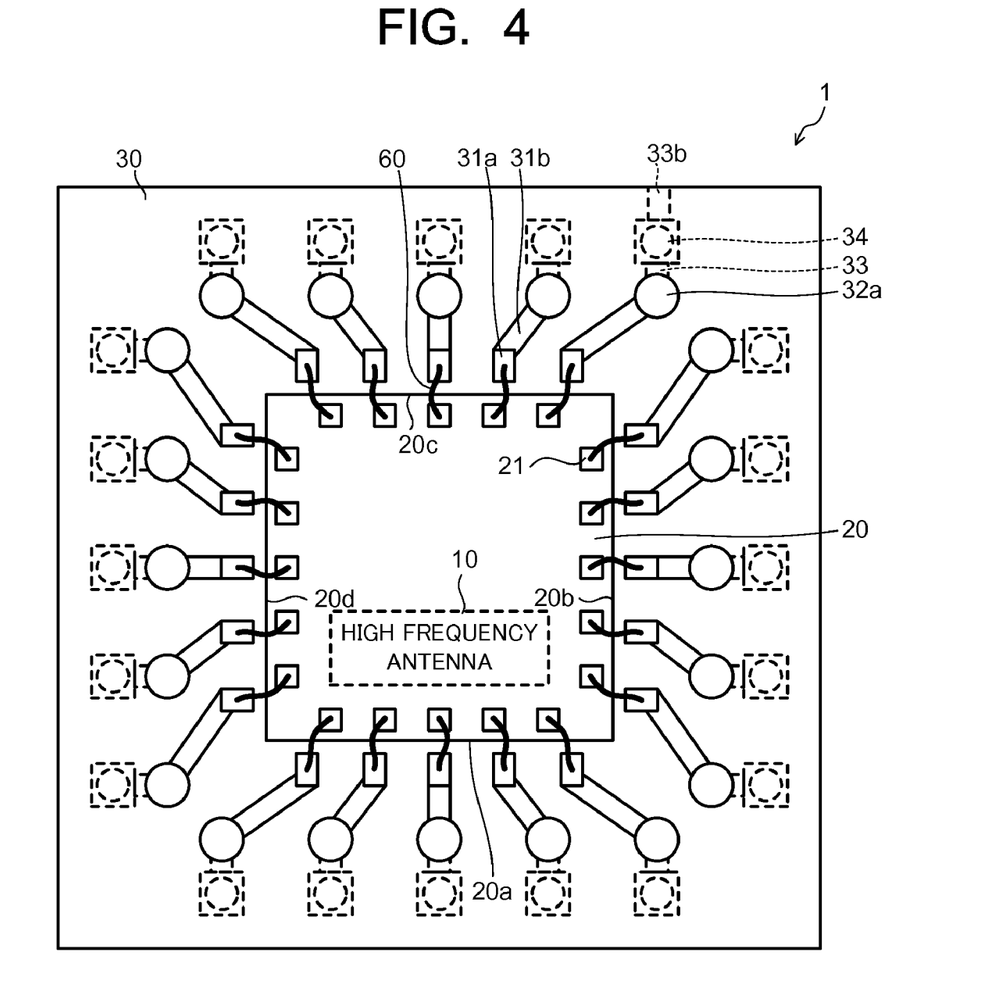
FIG. 4 is a transparent top view of the communication device according to the first embodiment.
Figure 5:
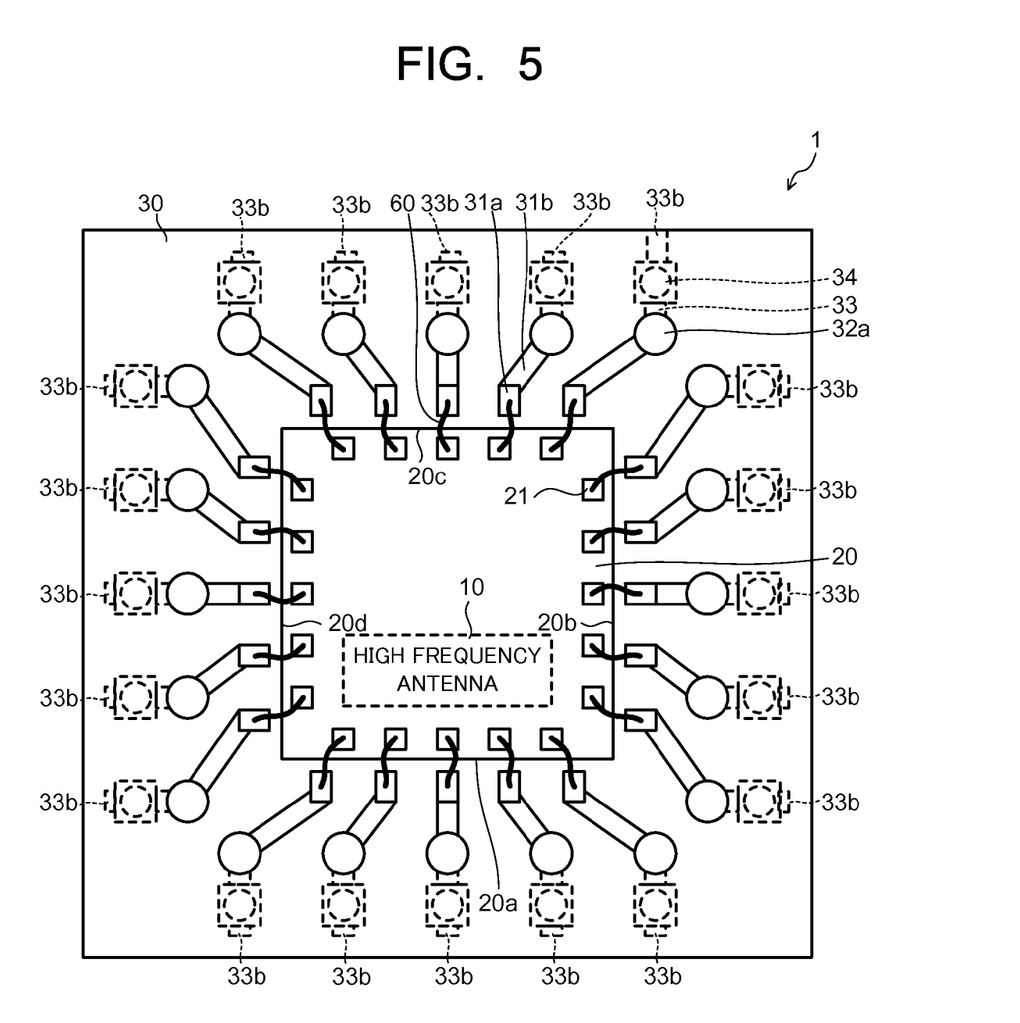
FIG. 5 is a transparent top view of the communication device according to the first embodiment.

FIG. 1 is a transparent cross-sectional view of a communication device 1 according to a first embodiment. FIG. 2 is a circuit structure diagram of a semiconductor chip 20 according to the first embodiment. FIG. 3 to FIG. 5 are transparent top views of the communication device according to the first embodiment. Hereinafter, this communication device 1 according to the first embodiment will be described with reference to FIG. 1 to FIG. 5.

The communication device 1 according to the first embodiment includes a semiconductor chip 20 having an high frequency high frequency antenna 10 and a mounting substrate 30 for mounting the semiconductor chip 20, and has a structure such that the semiconductor chip 20 is enclosed with an enclosing resin 40. The semiconductor chip 20 may be enclosed with a cap part covering the semiconductor chip 20 so that a gap is made between this cap part and an upper face of the semiconductor chip 20. In the description below, the side on which the semiconductor chip 20 is mounted is assumed as a front face of the mounting substrate.

The high frequency antenna 10 is formed inside the semiconductor chip 20, and has an operating frequency from a few GHz to several tens of GHz.

The semiconductor chip 20 is joined onto the front face of the mounting substrate 30 with a mounting member 50 such as solder. Further, an electrode 21 for inputting/outputting a signal formed on the semiconductor chip 20 is connected to a front face wiring 31 on the mounting substrate 30 by a bonding wire 60.

As illustrated in FIG. 2, the high frequency antenna 10, a high frequency circuit 201, an IF (intermediate frequency) band circuit 202, and a BB (base band) signal processing circuit 203 are formed on the semiconductor chip 20, each of which being connected to a power supply 204 and a ground 205. The high frequency circuit 201 receives a high frequency signal from the high frequency antenna 10. The IF band circuit 202 converts a received high frequency signal into a signal having an intermediate frequency. The BB signal processing circuit 203 further converts the signal converted into an intermediate frequency into a base band frequency.

These high frequency circuit 201, IF band circuit 202, and BB signal processing circuit 203 are connected to electrodes 21 formed on the semiconductor chip 20 via signal input/output wirings (I/O wirings). The power supply 204 and the ground 205 are also connected to the electrodes 21. Further, on the semiconductor chip 20, elements (for example, fuses, diodes, and so on) for protecting the high frequency circuit 201, the IF band circuit 202, and the BB signal processing circuit 203 are formed, and these circuit protection elements are connected to the electrodes 21 formed on the semiconductor chip 20 via signal input/output wirings (I/O wirings).

On the mounting substrate 30, a first wiring connected to the ground, a second wiring supplying power to the semiconductor chip, a third wiring connected to the protection elements or circuit of the semiconductor chip, and fourth wirings transmitting a signal from the semiconductor chip are formed by plating. The semiconductor chip 20 is mounted in a center portion of the front face of the substrate.

Specifically, the mounting substrate 30 includes front face wirings 31 and rear face wirings 33 which are metal wirings, a dielectric 32 having through holes 32a, and so on. The surface of a through hole 32a is covered with a conductor, connecting a front face wiring 31 and a rear face wiring 33 electrically. The rear face wirings 33 connect the through holes 32a and a BGA (ball grid array) 34 electrically. Here, the front face wirings 31, the rear face wirings 33, and the through holes 32a constitute the first to fourth wirings. The mounting substrate 30 is a printed wiring substrate (glass epoxy substrate) made of, for example, FR4 or the like. As the material for the mounting substrate 30, Teflon and resin, or ceramics such as aluminum oxide ($Al_2O_3$) and aluminum nitride (AlN) may be used, other than the FR4.

FIG. 3 and FIG. 4 are transparent top views of the communication device 1 according to the first embodiment, and illustrate also the rear face wirings 33 and the BGA 34 formed on the rear face of the mounting substrate 30. In FIG. 3 and FIG. 4, the front face wirings 31 formed on the front face of the mounting substrate 30 are illustrated with solid lines, and the rear face wirings 33 and the BGA 34 formed on the rear face of the mounting substrate 30 are illustrated with dashed lines. In addition, the front face wirings 31 are each constituted of an electrode 31a to which a bonding wire 60 is connected and a plating wiring 31b.

In this first embodiment, the front face wirings 31 and the rear face wirings 33 are formed by electric field plating. That is, when the front face wirings 31 and the rear face wirings 33 are formed, seed wirings for forming the front face wirings 31 and the rear face wirings 33 are formed to extend to a substrate edge portion of the mounting substrate 30, and thereafter the electric field plating is performed to form the front face wirings 31 and the rear face wirings 33. Subsequently, extended wirings 33b adjacent to the high frequency antenna 10 are removed. This is because when the extended wirings 33b adjacent to the high frequency antenna 10 are not removed, characteristics of the high frequency antenna 10 are deteriorated by a coupling capacitance between the high frequency antenna 10 and these extended wirings 33b.

Note that regarding the extended wirings 33b, there is left at least one of the extended wirings 33b of the rear face wirings 33 (third wiring) connected to the I/O wirings of the ground 205 (first wiring), the power supply 204 (second wiring), or the circuit protection elements of the semiconductor chip 20. This is because when the extended wirings 33b of the rear face wirings 33 (fourth wirings) connected to the I/O wirings of the high frequency circuit 201, the IF band circuit 202, and the BB signal processing circuit 203 are left, the extended wirings 33b electrostatically couple to these I/O wirings, adversely affecting a signal flowing through the I/O wirings.

Here, the reason to leave the 33b is that the left extended wiring serves the function to electrically connect an electrode for electric field plating and the pattern on the substrate, and the function to prevent active elements on the semiconductor chip from being broken by electrostatic discharge damage in the process of connecting the electrodes on the semiconductor chip and electrodes for semiconductor chip on the substrate.

Further, note that the length of wirings including the electrodes 21 to the extended wirings 33b of the semiconductor chip 20 should not be an integral multiple of a half of the operating wavelength of the high frequency antenna 10. This is because when the length of wirings including the electrodes 21 to the extended wirings 33b of the semiconductor chip 20 is an integral multiple of a half of the operating wavelength of the high frequency antenna 10, resonance with the high frequency antenna 10 occurs, which adversely affects the high frequency antenna 10 and deteriorates characteristics of the high frequency antenna 10.

In the example illustrated in FIG. 3, the high frequency antenna 10 is formed to be deviated to a lower side (side 20a) of the semiconductor chip 20 when the mounting substrate 30 is seen from the front side. Accordingly, in FIG. 3, the extended wiring 33b of the rear face wiring 33 is left, which is connected via the front face wiring 31 and the through hole 32a to the electrode 21 formed on the side of a side 20b in the vicinity of the corner between the side 20b and a side 20c of the semiconductor chip 20. That is, in the example illustrated in FIG. 3, there is left one of the extended wirings 33b farthest from the side 20a to which the high frequency antenna 10 is formed to be deviated.

In FIG. 4, the extended wiring 33b of the rear face wiring 33 is left, which is connected via the front face wiring 31 and the through hole 32a to the electrode 21 formed on the side of the side 20c in the vicinity of the corner between the side 20b and the side 20c of the semiconductor chip 20. Further, it is also possible to leave the extended wiring 33b of the rear face wiring 33 connected via the front face wiring 31 and the through hole 32a to the electrode 21 formed in the vicinity of the side 20c of the semiconductor chip, or to leave the extended wiring 33b of the rear face wiring 33 connected via the front face wiring 31 and the through hole 32a to the electrode 21 formed in the vicinity of the corner between the side 20c and a side 20d of the semiconductor chip 20.

In addition, as illustrated in FIG. 5, the extended wirings 33b to be removed (the extended wirings 33b other than the extended wiring 33b of the rear face wiring 33 connected via the front face wiring 31 and the through hole 32a to the electrode 21 formed on the side of the side 20c in the vicinity of the corner between the side 20b and the side 20c of the semiconductor chip 20) may be in a state of being partially left.

In the example illustrated in FIG. 5, remaining portions of the extended wirings 33b are in a state of being connected electrically to the BGA 34, but do not exist between the electrodes 21 of the semiconductor chip 20 and the BGA 34, which are paths of a signal. Accordingly, even in a state that the extended wirings 33b are partially left, influence on the high frequency antenna 10 is small.

As described above, in the communication device 1 according to the first embodiment, among the extended wirings 33b needed when the front face wirings 31 and the rear face wirings 33 are formed, the extended wirings 33b of the rear face wirings 33 connected electrically to the electrodes 21 formed in the vicinity of the high frequency antenna 10 are removed. Thus, deterioration of characteristics of the high frequency antenna 10 due to a coupling capacitance between the high frequency antenna 10 and the extended wirings 33b can be inhibited. Further, all the components needed for communication (high frequency antenna 10, high frequency circuit 201, IF band circuit 202, and BB signal processing circuit 203) are formed on the semiconductor chip 20, and thus an inexpensive small communication device 1 is obtained. Moreover, undesired radiation by the extended wirings 33b can be inhibited, and thus adverse effects to the circuit in the semiconductor chip 20 by this undesired radiation can be inhibited.

Second Embodiment

Figure 6:
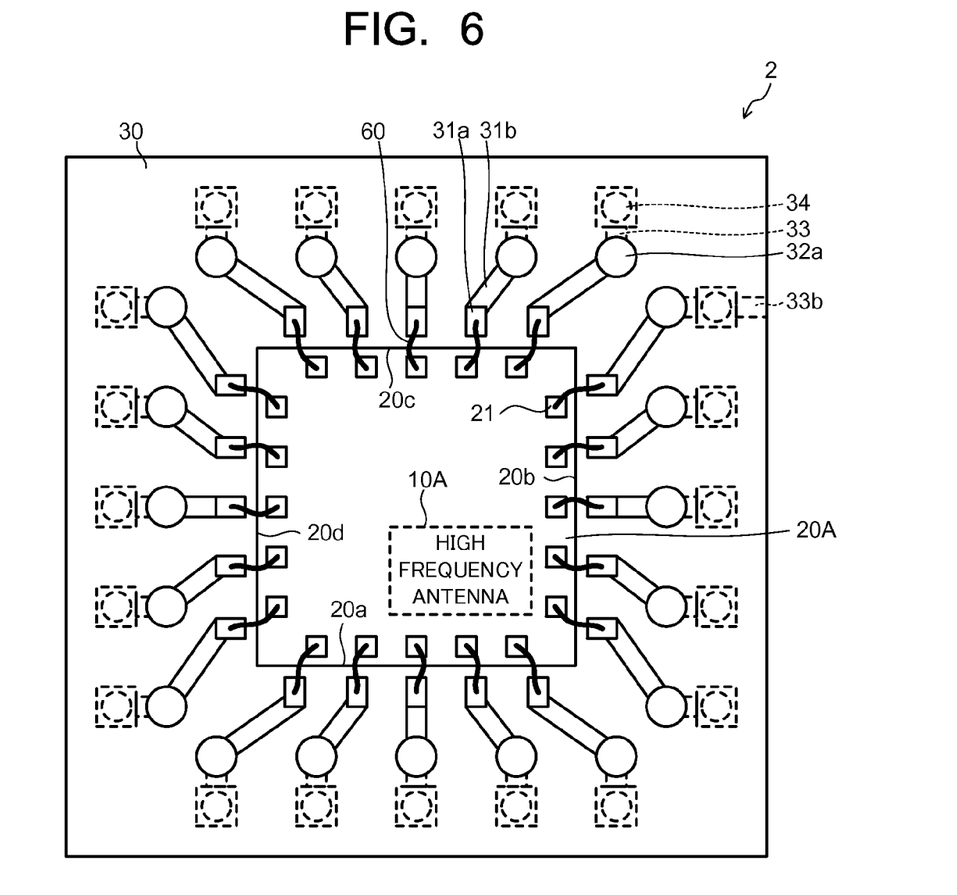
FIG. 6 is a transparent top view of a communication device according to a second embodiment.
Figure 7:
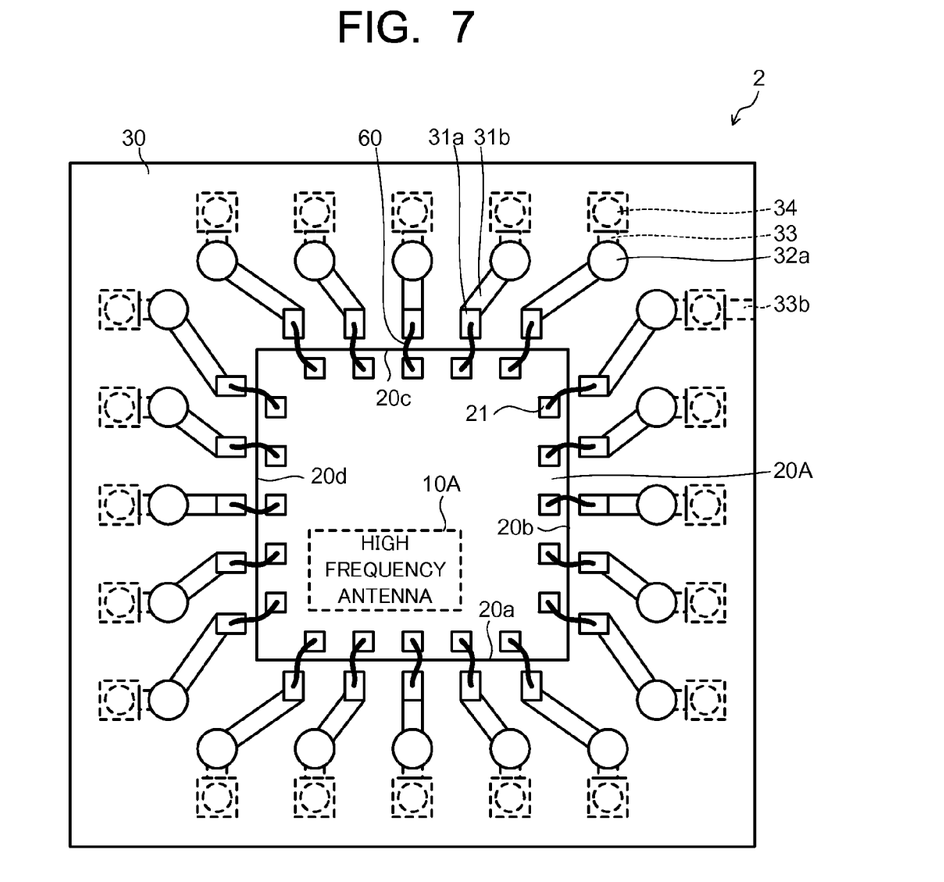
FIG. 7 is a transparent top view of the communication device according to the second embodiment.

FIG. 6 and FIG. 7 are transparent top views of a communication device 2 according to a second embodiment. Hereinafter, the structure of the communication device 2 according to the second embodiment will be described with reference to FIG. 6 and FIG. 7. The same components as those described with FIG. 1 are denoted by the same reference signs, and descriptions thereof are omitted.

In the communication device 1 according to the first embodiment, the high frequency antenna 10 is formed along the side 20a of the semiconductor chip 20. In the example illustrated in FIG. 6 of the second embodiment, an high frequency antenna 10A is formed to be deviated to the corner between the side 20a and the side 20b of a semiconductor chip 20A. Further, the extended wiring 33b, which is one of the extended wirings 33b farthest from the corner between the side 20a and the side 20b to which the high frequency antenna 10A is formed to be deviated, of the rear face wiring 33 connected to an electrode 21 formed in the vicinity of the corner between the side 20b and the side 20c of the semiconductor chip 20A is left, and the other extended wirings 33b are removed. Further, in the example illustrated in FIG. 7, the high frequency antenna 10A is formed to be deviated to the corner between the side 20a and the side 20b of the semiconductor chip 20A.

Further, in the example illustrated in FIG. 7, the extended wiring 33b of the rear face wiring 33 connected via the front face wiring 31 and the through hole 32a to the electrode 21 formed in the vicinity of the corner between the side 20b and the side 20c, diagonally opposing the corner to which the high frequency antenna 10A is formed to be deviated, is left. Accordingly, as compared to the example of FIG. 6, the distance between the high frequency antenna 10A and the extended wiring 33b is long, and the effect of inhibiting deterioration of characteristics of the high frequency antenna 10 due to a coupling capacitance between the high frequency antenna 10A and the extended wiring 33b becomes stronger. Other effects are the same as those of the communication device 1 according to the first embodiment.

As described above, in the communication device 2 according to the second embodiment, similarly to the communication device 1 according to the first embodiment, the extended wirings 33b of the rear face wirings 33 connected electrically to the electrodes 21 formed in the vicinity of the high frequency antenna 10A are removed. Thus, deterioration of characteristics of the high frequency antenna 10 due to a coupling capacitance between the high frequency antenna 10 and the extended wirings 33b can be inhibited.

Third Embodiment

Figure 8:
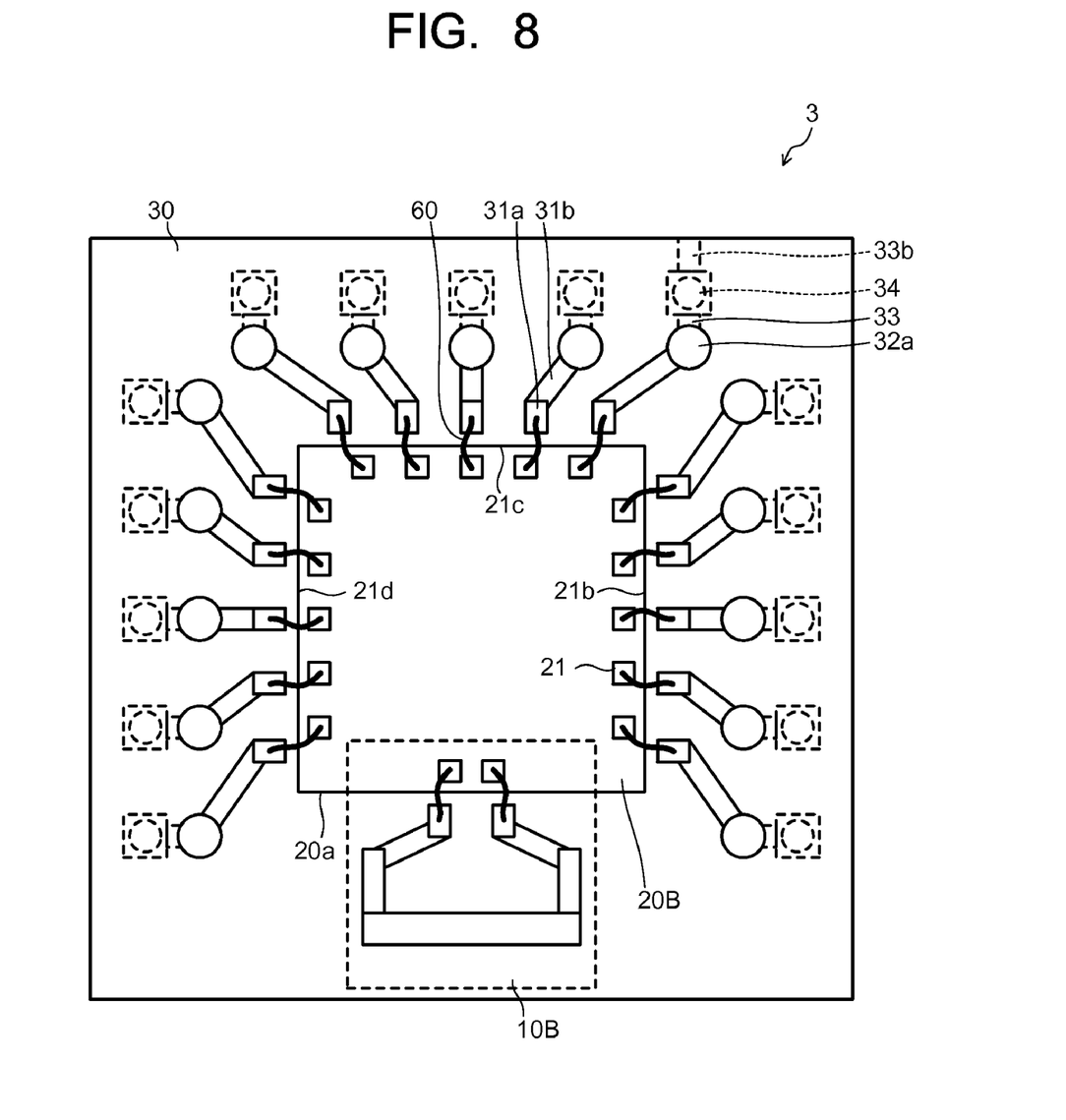
FIG. 8 is a transparent top view of a communication device according to a third embodiment.

FIG. 8 is a transparent top view of a communication device 3 according to a third embodiment. Hereinafter, the structure of the communication device 3 according to the third embodiment will be described with reference to FIG. 8. The same components as those described with FIG. 1 are denoted by the same reference signs, and descriptions thereof are omitted.

In the communication device 1 according to the first embodiment, the high frequency antenna 10 is formed on the semiconductor chip 20. The third embodiment is different in that an high frequency antenna 10B is formed on the mounting substrate 30. In the third embodiment, similarly to the communication device 1 according to the first embodiment, the extended wiring 33b is left, which is one of the extended wirings 33b farthest from the side 20a to which the high frequency antenna 10B is formed to be deviated, and the extended wirings 33b of the rear face wirings 33 connected electrically to electrodes 21 formed in the vicinity of the high frequency antenna 10B are removed. Thus, deterioration of characteristics of the high frequency antenna 10 due to a coupling capacitance between the high frequency antenna 10 and the extended wirings 33b can be inhibited. Other effects are the same as those of the communication device 1 according to the first embodiment.

Fourth Embodiment

Figure 9:
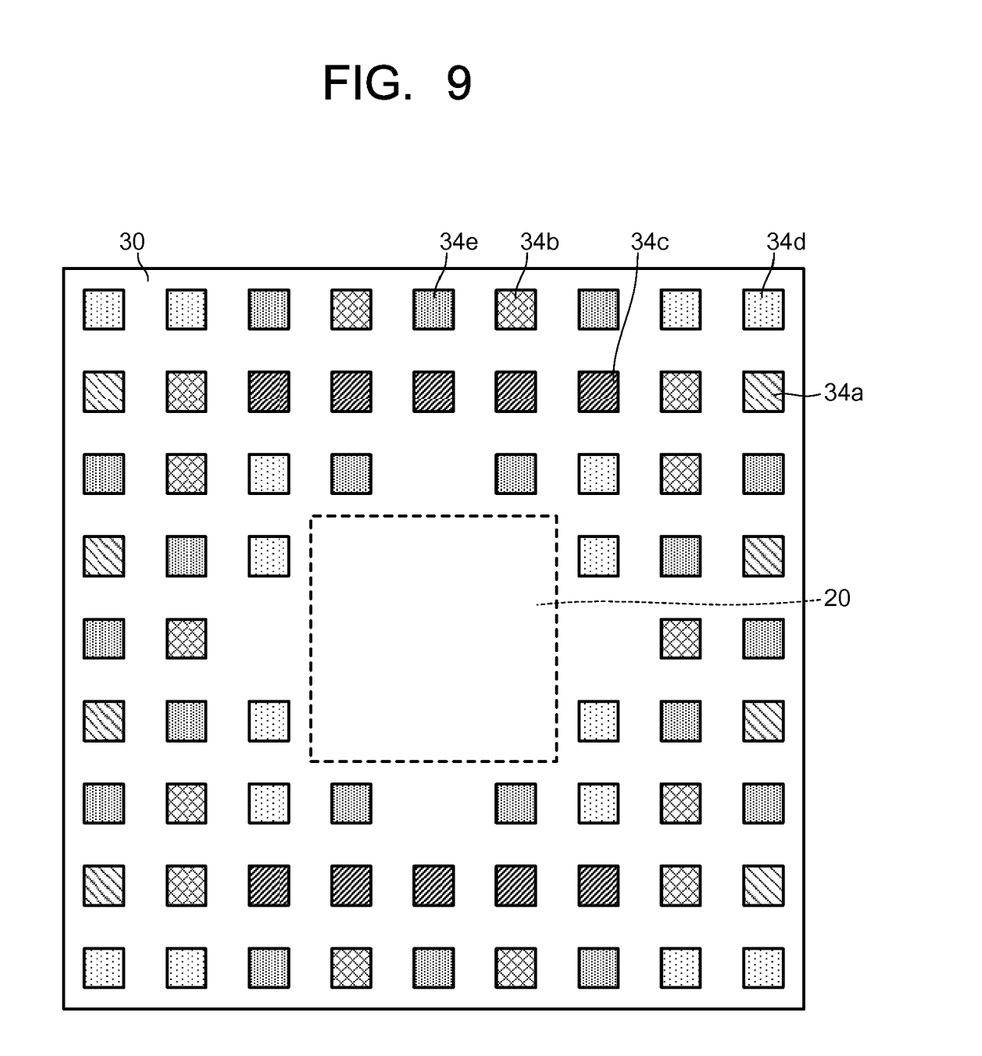
FIG. 9 is a rear side view of a communication device according to a fourth embodiment.
Figure 10:
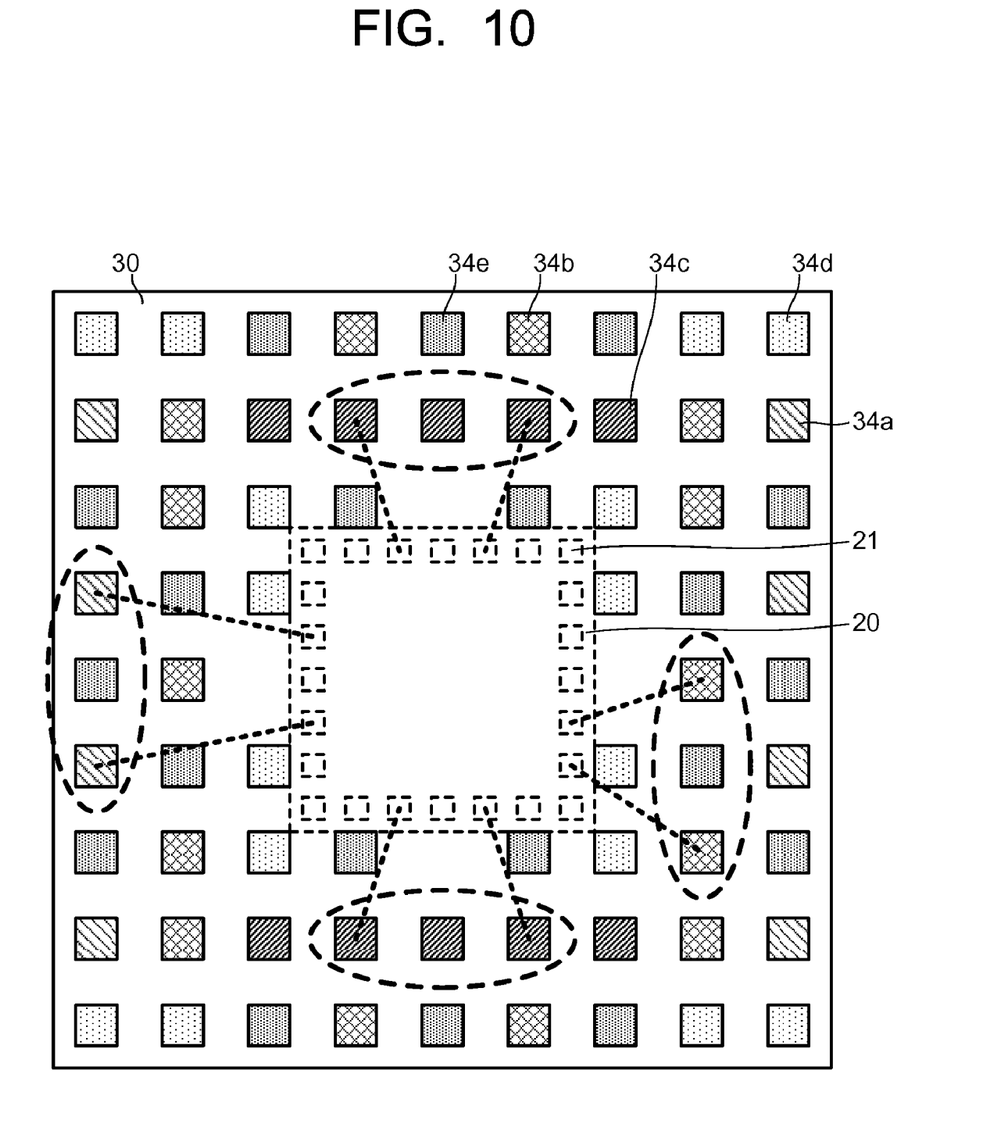
FIG. 10 is a rear side view of the communication device according to the fourth embodiment.

FIG. 9 and FIG. 10 are rear side views of a communication device 4 according to a fourth embodiment. Hereinafter, the structure of the communication device 4 according to the fourth embodiment will be described with reference to FIG. 9 and FIG. 10. The same components as those described with FIG. 1 are denoted by the same reference sings, and descriptions thereof are omitted. Note that on FIG. 9 and FIG. 10, the semiconductor chip 20 mounted on the front face of the mounting substrate 30 is illustrated with dashed lines.

As illustrated in FIG. 9 and FIG. 10, a plurality of BGAs 34 are disposed on a rear face of the mounting substrate 30 of the communication device 4. The plurality of BGAs 34 can be categorized by types of signals to be transmitted into five groups: BGAs 34a for high frequency band (RF band) signal, BGAs 34b for IF band signal, BGAs 34c for BB band signal, BGAs 34d for power supply, and BGAs 34e for ground.

In the communication device 4 according to the fourth embodiment, among these five groups, the BGAs 34a for high frequency signal are disposed on the outermost peripheral side of the mounting substrate 30, that is, at positions farthest from the semiconductor chip 20, and at least a part of the BGAs 34d for power supply and the BGAs 34e for ground is disposed on the innermost peripheral side of the mounting substrate 30, that is, at positions close to the semiconductor chip 20.

Further, as illustrated in FIG. 10, for pairs of IQ signals and differential signals, BGAs 34 such that distances from the electrodes 21 of the semiconductor chip 20 to the BGAs 34 are substantially equal may be selected as connection destinations. In this way, delays occurring from differences in signal wiring lengths can be suppressed.

By disposing the BGAs 34 as described above, the influence on the high frequency antenna 10 of high frequency signals passing the BGAs 34 from the electrodes 21 of the semiconductor chip 20 can be reduced effectively. Further, as illustrated in FIG. 10, for pairs of IQ signals and differential signals, by selecting BGAs 34 such that distances from the electrodes 21 of the semiconductor chip 20 to the BGAs 34 are substantially equal as connection destinations, delays occurring from differences in signal wiring lengths can be suppressed. Other effects are the same as those of the communication device 1 according to the first embodiment.

Fifth Embodiment

Figure 11:
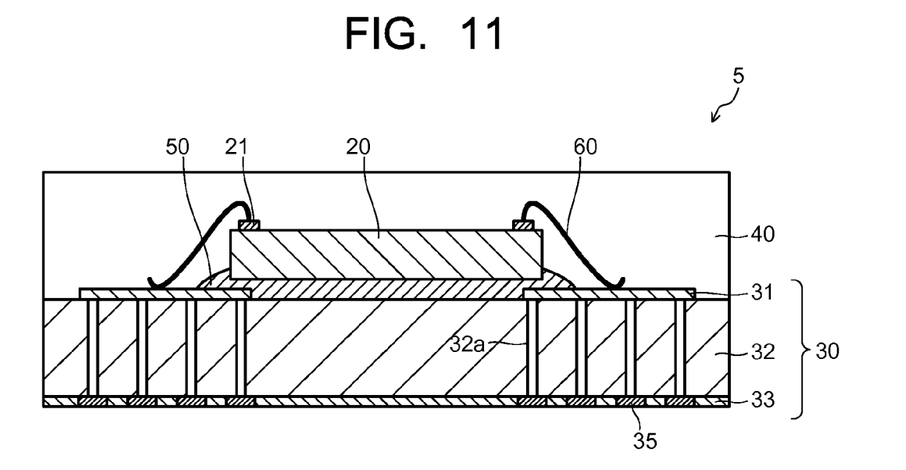
FIG. 11 is a transparent cross-sectional view of a communication device according to a fifth embodiment.
Figure 12:
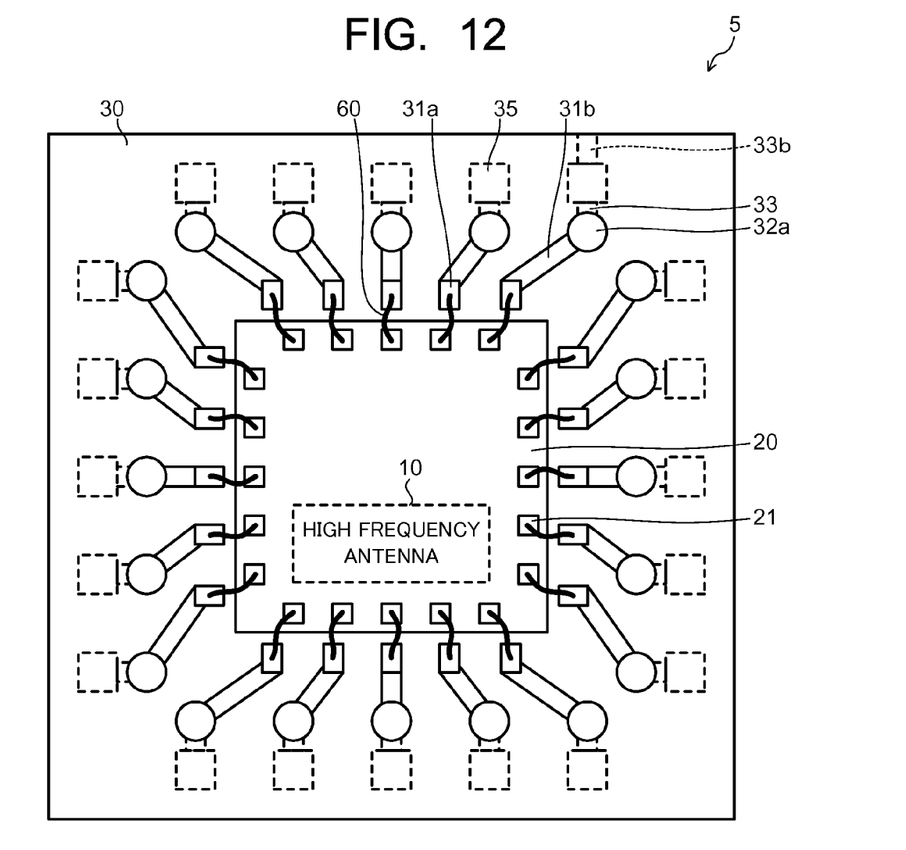
FIG. 12 is a transparent top view of the communication device according to the fifth embodiment.

FIG. 11 is a transparent cross-sectional view of a communication device 5 according to a fifth embodiment. FIG. 12 is a transparent top view of the communication device 5 according to the fifth embodiment. Hereinafter, the structure of the communication device 5 according to the fifth embodiment will be described with reference to FIG. 11 and FIG. 12. The same components as those described with FIG. 1 are denoted by the same reference signs, and descriptions thereof are omitted.

The fifth embodiment is different from the communication device 1 illustrated in FIG. 1 according to the first embodiment in that it includes an LGA (land grid array) instead of the BGA 34, on the rear face of the mounting substrate 30. The LGA is an array in which flat electrode pads are arranged in a lattice form instead of solder balls of the BGA. Characteristics of the LGA include not using solder having high resistance compared to copper, high electric power density due to a surface contact, high physical strength due to a simple structure, and so on. Other effects are the same as those of the communication device 1 according to the first embodiment.

Sixth Embodiment

Figure 13:
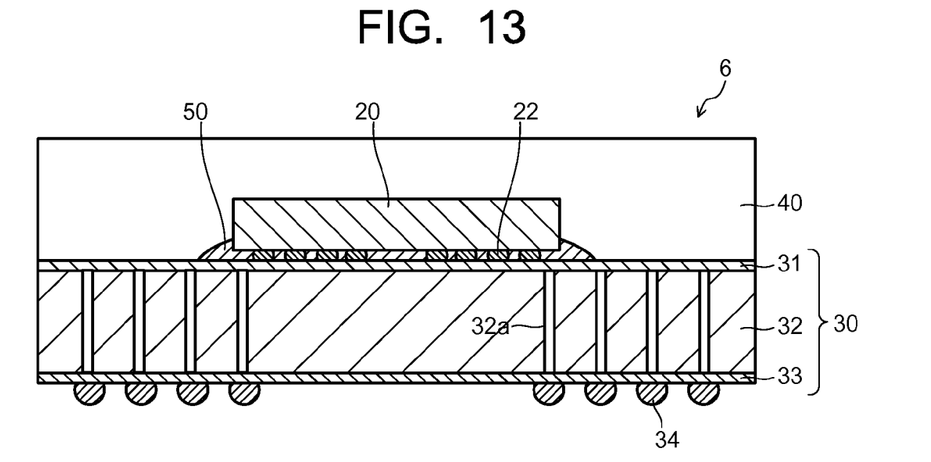
FIG. 13 is a transparent cross-sectional view of a communication device according to a sixth embodiment.
Figure 14:
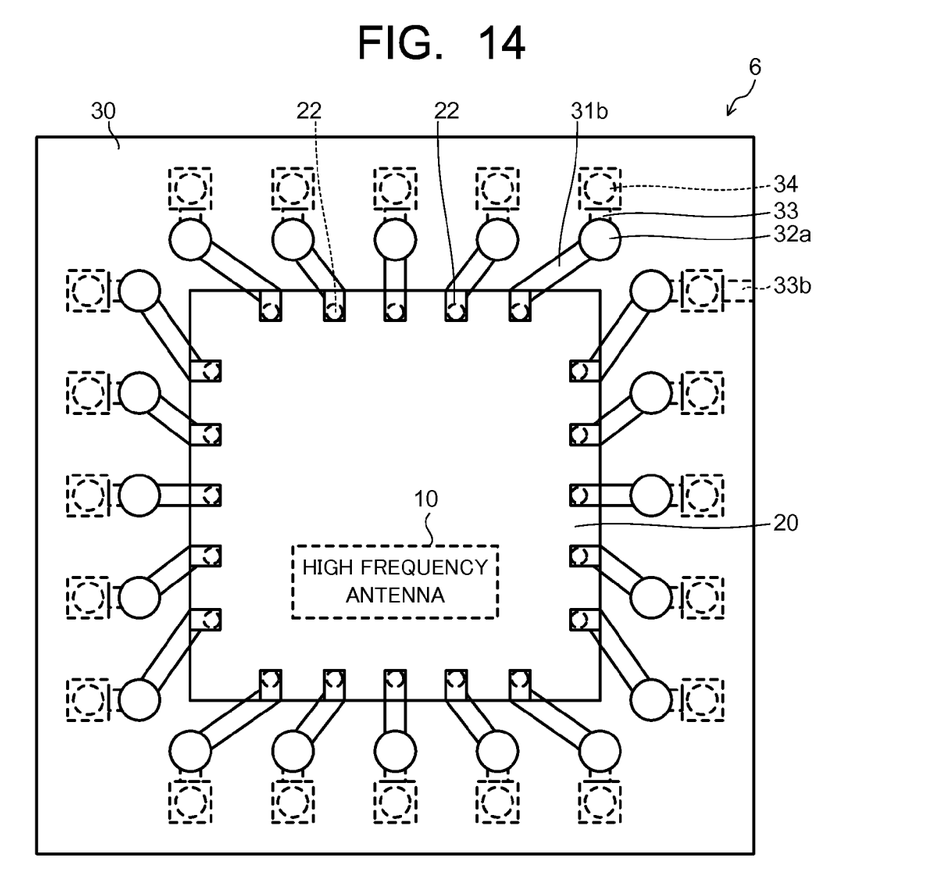
FIG. 14 is a transparent top view of the communication device according to the sixth embodiment.

FIG. 13 is a transparent cross-sectional view of a communication device 6 according to a sixth embodiment. FIG. 14 is a transparent top view of the communication device 6 according to the sixth embodiment. Hereinafter, the structure of the communication device 6 according to the sixth embodiment will be described with reference to FIG. 13 and FIG. 14. The same components as those described with FIG. 1 are denoted by the same reference signs, and descriptions thereof are omitted.

The communication device 6 according to the sixth embodiment is different from the communication device 1 according to the first embodiment in that it has what is called a bump structure including electrodes 22 on the rear face of the semiconductor chip 20, and these electrodes 22 and electrodes 31*a* provided on the front face of the mounting substrate 30 are connected. In the communication device 6 according to the sixth embodiment, the bonding wires 60 are not necessary, and deterioration of high frequency characteristics due to the bonding wires 60 can be suppressed. Further, the size of the communication device 6 can be reduced further by the bump structure including the electrodes 22 on the rear face of the semiconductor chip 20.

Other Embodiments

While certain embodiments have been described, these embodiments have been presented by way of example only, and are not intended to limit the scope of the inventions. Indeed, the novel embodiment described herein may be embodied in a variety of other forms; furthermore, substitutions and changes in the form of the embodiments described herein may be made without departing from the spirit of the inventions. The accompanying claims and their equivalents are intended to cover such forms or modifications as would fall within the scope and spirit of the inventions.

For example, other than the BGAs 34 and the LGA 35, the lower electrodes may be replaced with notch electrodes, electrodes having a waveguide structure, electrodes using electromagnetic coupling, or the like. Further, the BGAs 34 included in the communication devices 2 to 4 according to the second to fourth embodiments may be replaced with the LGA 35, notch electrodes, electrodes having a waveguide structure, electrodes using electromagnetic coupling, or the like. Moreover, the present invention may be applied to radar, sensor, or the like other than radios.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication device, comprising:
an antenna transmitting/receiving a high frequency signal;
a semiconductor chip having four corners and four sides processing the high frequency signal; and
a substrate on which a first wiring connected to ground, a second wiring supplying power to the semiconductor chip, a third wiring connected to a protection element or circuit of the semiconductor chip, and fourth wirings transmitting a signal from the semiconductor chip are formed by plating, and the semiconductor chip is mounted,
wherein the substrate further has a first to fourth substrate main face electrodes formed at front ends of the first to fourth wirings on a substrate main face, which is a semiconductor mounting face, for connecting the first to fourth wirings to the semiconductor chip and a first to fourth substrate rear face electrodes formed at front ends of the first to fourth wirings on a substrate rear face opposite to the semiconductor mounting face for connecting the first to fourth wirings to an external device;
wherein at least one of the first to third wirings has an extended wiring for plating, which is formed to extend to a substrate edge portion for performing the plating, and at least one of the fourth wirings does not have the extended wiring for plating, which is formed to extend to the substrate edge portion for performing the plating;
wherein the antenna is disposed to be deviated to one corner among four corners of the semiconductor chip or to one side among four sides of the semiconductor chip from a center portion of the semiconductor chip; and
wherein the extended wiring for plating is formed by extending the first to third wirings to the substrate edge portion at a corner or along a side other than the one corner or the one side.

2. The communication device according to claim 1,
wherein the antenna is disposed to be deviated to one corner among four corners of the semiconductor chip or to one side among four sides of the semiconductor chip from a center portion of the semiconductor chip; and
wherein the extended wiring for plating is formed by extending the first to third wirings to the substrate edge portion at an opposing corner or along an opposing side farthest from the one corner or the one side.

3. The communication device according to claim 1,
wherein the antenna is disposed outside of one side among four sides of the semiconductor chip; and
wherein the extended wiring for plating is formed by extending the first to third wirings to the substrate edge portion at a side other than the one side.

4. The communication device according to claim 1,
wherein at least one of the first and second electrodes is formed at a position closer to the semiconductor chip than the fourth electrodes.

5. The communication device according to claim 1,
wherein at least one pair of the fourth wirings is wirings handling differential signals in a pair, and lengths of two wirings to be a pair are substantially equal.

6. The communication device according to claim 1,
wherein a length of the extended wiring for plating or lengths of the first to fourth wirings including the extended wiring for plating is or are not an integral multiple of a half wavelength of an operating frequency of the antenna.

7. The communication device according to claim 1,
wherein I/O electrodes of a semiconductor chip are formed on the semiconductor chip, the I/O electrodes of the semiconductor chip and the substrate main face electrodes are structured to be connected by a bonding wire, and the antenna is an antenna having a structure including the bonding wire as a part of the structure with the substrate main face electrodes for a signal having an operating frequency of the antenna in the semiconductor chip being only an electrode for the antenna, or is an antenna having an on-chip structure formed on the semiconductor chip and does not have the substrate main face electrodes for the signal having the operating frequency of the antenna.

8. The communication device according to claim 1,
wherein the electrodes are BGA electrodes or LGA electrodes.

* * * * *